United States Patent [19]

Riggle et al.

[11] Patent Number: 5,377,133
[45] Date of Patent: Dec. 27, 1994

[54] SYSTEM FOR ENHANCED IMPLEMENTATION OF ADD-COMPARE-SELECT (ACS) FUNCTIONS

[75] Inventors: Charles M. Riggle; Nersi Nazari, both of Colorado Springs, Colo.

[73] Assignee: Digital Equipment Corporation, Maynard, Mass.

[21] Appl. No.: 866,996

[22] Filed: Apr. 7, 1992

[51] Int. Cl.$^5$ .............................................. G06F 7/38
[52] U.S. Cl. .................................................. 364/736
[58] Field of Search ................... 364/736; 371/43–45; 340/146.2

[56] References Cited

U.S. PATENT DOCUMENTS

| | | |
|---|---|---|
| 4,087,787 | 5/1978 | Acampora . |
| 4,504,872 | 3/1985 | Petersen . |
| 4,536,878 | 8/1985 | Rattlingourd et al. . |
| 4,583,078 | 4/1986 | Shenoy et al. . |
| 4,614,933 | 9/1986 | Yamashita et al. . |
| 4,748,626 | 5/1988 | Wong . |
| 4,757,506 | 7/1988 | Heichler . |
| 4,763,328 | 8/1988 | Shimoda et al. . |
| 4,802,174 | 1/1989 | Hiraiwa et al. . |
| 4,847,871 | 7/1989 | Matsushita et al. . |
| 5,027,374 | 6/1991 | Rossman . |

FOREIGN PATENT DOCUMENTS 2058102 6/1992 Canada .

OTHER PUBLICATIONS

*A 100MBit/s Viterbi Decoder Chip: Novel Architecture and its Realization,* Gerhard Fettweis, Heinrich Meyr, ICC'90, paper No. 257, session 307.4, Atlanta Ga. USA, Apr. 16–19 1990.

*Algorithms and Architectures for Concurrent Viterbi Decoding,* Horng-Dar Lin and David G. Messerschmitt, IEEE 1989, pp. 0836–0840.

*A 120 MBit/s Coded 8PSK Modem with Soft-Decision Viterbi Decoder,* T. Fujino, Y. Moritani, M. Miyake, K. Murakami, Y. Sakato and H. Shiino, IEEE 1986, pp. 1774–1780.

*Application of Probabilistic Decoding to Digital Magnetic Recording Systems,* H. Kobayashi, IBM J. Res. Develop, Jan. 1971, pp. 64–74.

*Cascaded Feedforward Architectures for Parallel Viterbi Decoding,* Gerhard Fettweis, Heinrich Meyr, Aachen University of Technology, pp. 978–981.

*Error Bounds for Convolutional Codes and an Asymptotically Optimum Decoding Algorithm,* Andrew J. Viterbi, IEEE, Trans on Information Theory, Apr. 1967, pp. 260–269.

(List continued on next page.)

Primary Examiner—Tan V. Mai
Attorney, Agent, or Firm—Arnold, White & Durkee

[57] ABSTRACT

An improved system and method is provided for enhanced add-compare-select (ACS) implementation which is particularly adapted to time-nesting or overlapping of the time offsets for add and compare operations. The compare operation is implemented as a sequential bottom-up procedure whereby two numerical quantities are compared by first declaring one of the quantities as a "contingent" smaller or larger quantity. Subsequently, the least significant bits LSBs of the quantities are compared and the earlier contingent designation is retained unless the smaller of the compared bits is found to correspond to the quantity not previously designated as the "contingent" smaller quantity, whereupon the "contingent" designation is transferred to the previously un-designated quantity corresponding to the smaller of the compared bits. The process is iterated until all bit pairs in the compared quantities have been examined and the "contingent" smaller quantity remaining at that point is defined to be the "final" smaller quantity and constitutes the result of the overall compare operation. The enhanced ACS implementation compresses the computation time by almost a factor of two compared to traditional ACS implementations using top-down compare operations, without significantly affecting logic complexity of the system and eliminates the need for tie breaking.

3 Claims, 4 Drawing Sheets

OTHER PUBLICATIONS

*Viterbi Detector Implementation; An Algorithmic Overview*, Nersi Nazari, Digital Equipment Corporation, Apr. 22, 1991.

C. B. Shung, et al., "A 30Mhz Trellis Codec Chip for Partial Response Channels"; *IEEE Journal of Solid-State Circuits*, vol. 26, No. 12, Dec. 1991, pp. 1981–1987.

K. J. Knudson, "Producing Soft-Decision Information at the Output of a Class IV Partial Response Viterbi Detector"; *International Conference on Communications*, v. 2, Jun. 1991, Denver, US pp. 820–824.

Hiroyuki Yashima, et al., "A New Type of Viterbi Decoding With Path Reduction"; *IEEE Global Telecommunications Conference*, v. 3, Nov. 1989, Dallas, Te. US pp. 1714–1718.

Lineu C. Barbosa, "Maximum Likelihood Sequence Estimators: A Geometric View"; *IEEE Transactions on Information Theory*, vol. 35, No. 2, Mar. 1989, N.Y., N.Y. pp. 419–427.

K. Yokoyama, et al., "Digital Videotape Recorder"; *NHK Technical Monograph*, No. 31, Mar. 1982, pp. 3–26.

SYSTEM FOR ENHANCED IMPLEMENTATION OF ADD-COMPARE-SELECT (ACS) FUNCTIONS

FIELD OF THE INVENTION

The present invention generally relates to optimized implementation of sequential binary addition and compare operations. More specifically, this invention is directed to an enhanced technique for implementing add-compare-select (ACS) operations adapted for use with digital computer implementations such as the hardware implementation of the Viterbi algorithm.

DESCRIPTION OF RELATED ART

The use of add-compare-select (ACS) operations is important in digital computer implementations wherein sequential decision-making involves the steps of binary addition of two pairs of numerical quantities in association with a related compare operation of the two addition results aimed at determining the relative numerical value of the pair of compared numerical quantities in order to identify the smaller or the larger of the quantities.

Such ACS operations are, for instance, integral to digital implementations of the well-known Viterbi algorithm for use in solving a variety of digital estimation problems. The Viterbi algorithm is a specific application of dynamic programming for identifying the shortest path through a finite-state discrete-time state transition diagram (referred to as a trellis) and is widely used for divergent applications in digital communications, speech recognition, magnetic recording, etc.

Viterbi decoders are specific implementations of the Viterbi algorithm which are of particular importance in digital data communication applications where significant inter-symbol interference exists. Although Viterbi decoders constitute efficient and successful strategies for data detection, an inherent limitation to optimized implementation thereof is the recursive nature of the selection procedure used for choosing survivor paths, whereby the decoder proceeds to a subsequent stage of decoding only after resolution of the survivor paths of relevant states in all prior stages.

More specifically, a Viterbi detector unit is based on periodic examination of metrics associated with alternate sequences of recorded or transmitted bits, wherein each sequence is typically labeled as a "path" the associated metric is designated as a "path metric" and the period of examination is defined as a bit cell time. The most probable correct path is then typically determined by choosing a minimum path metric based on an iterative procedure involving successive comparison of associated path metrics.

In particular, two paths with identical past within the constraint length are examined. Since the recorded or transmitted bit depends only on the constraint length corresponding to a finite number of neighbor bits, it becomes possible to abandon the path associated with the larger of the two path metrics corresponding to each path pair. Consequently, the number of possible paths can be restricted to a finite value by abandoning half of the total number of paths each time a new bit is added and examined during the data detection procedure. This process of path abandonment in order to compute the best path to each node of the trellis is executed by a sequence of operations commonly referred to as add-compare-select or ACS.

In practical implementation of Viterbi decoders, a pipeline of three processing units is typical and includes a transition metric unit for computing a metric corresponding to each possible transition from one state to another in the trellis, an ACS unit for carrying out the ACS recursion process, and a survivor memory unit for selecting the appropriate output bits. In a Viterbi decoder, the ACS unit typically comprises the processing bottleneck in high data rate implementations because of the non-linear feedback loop used for realizing the add and compare operations necessary prior to selection of a specific path. This is particularly true because an ACS operation must be completed each bit cell time in order to prevent growth of the number of possible paths through the trellis.

Within the ACS unit, the "add" operation is basically binary addition of a pair of "transition metrics" to a given pair of related path metrics in order to generate a new path metric by selecting the smaller of the two addition results. In terms of complexity, the simplest strategy employed in conventional Viterbi decoder implementations for implementing an "add" is the sequential recursion of the steps of (i) adding least significant bit (LSB) to least significant bit, and generating the appropriate bit and carry, and (ii) adding the next LSBs with the prior carry, in order to generate another bit and appropriate carry, until all bits and carries have been exhausted. This "add" operation, accordingly, is a bottom-up process wherein results of the LSB addition are known prior to results from the next LSB additions.

This inherently sequential bottom-up add operation is relatively time consuming, although complex logic networks may be employed to reduce computation time by executing add operations using so-called carry-look-ahead strategies. However, some degree of time offset always exists because the complexity or depth of logic levels for high order bits is always greater than that for low order bits, thereby resulting in increase in time consumption. Furthermore, since the complexity of carry-look-ahead adders grows rapidly as a function of number of bits, these adders are generally limited to four (4) bits in practice.

In conventional ACS unit implementations, the completion of add operations is followed by comparison of the computed new path metrics in order to select the optimum path metric thereof. For the "compare" operation, the simplest strategy, in terms of system complexity, is to recursively perform the steps of (i) examining the highest order bits first in order to select the smaller bit, if possible; and (ii) if the highest order bits are found to be equal, then comparing the next highest order bits in order to select the smaller bit value, if possible, until all bits in the compared quantities have been examined.

As in the case of add operations, the computation time involved in performing the sequential "compare" operation can be reduced by employing a more complex logic network so that the compare sequence of operations is performed in parallel. However, computation time for low order bits is unavoidably larger than for high order bits because of the inherently higher complexity for comparing low order bits.

In view of the bottom-up implementation of the add operation and the top-down implementation of the compare operation in traditional ACS unit configurations, time-nesting or over-lapping of the time offsets involved in the add and compare operations is not possible; this is because the add operation offset is from low order to high order bit while the compare operation offset is from high order to low order bit. Since the computation time available for identification and selection of the optimized path based on the results of the ACS unit operation is relatively small, it becomes imperative to compress the ACS time without significantly increasing system complexity.

Traditional approaches to optimized implementation of the ACS function have involved the use of fast relatively-parallel add operations in combination with correspondingly fast parallel compare operations; however, the obvious drawback associated with such ACS implementations has been increased logic complexity resulting in substantially increased power and cost requirements. An alternative approach is the use of so-called carry-save operations which permit all bit-wise add operations to be implemented in parallel and compare operations to be done two bits at a time, in order to minimize time offset; this approach also has the drawback of increased system complexity.

Another approach to faster implementation of the Viterbi algorithm has been the use of a pipeline processing function whereby the add and compare-select operations are realized in two different stages using a parallel word scheme. Even with this approach, the increase in implementation speed is restricted. Moreover, the complexity and size of the detector are doubled since it becomes necessary to retain twice the number of states which would otherwise be needed.

There, accordingly, exists a distinct need for an enhanced system for implementing ACS operations which optimizes the associated computation time by time-nesting or over-lapping of the add/compare offsets without substantially affecting the logic complexity necessary for the overall ACS implementation, as applied particularly to digital data detection applications, such as Viterbi detectors and the like.

SUMMARY OF THE INVENTION

Briefly, in accordance with the principles of the present invention, an improved system is provided for implementing add-compare-select ("ACS") operations whereby the "compare" operation is realized according to a sequential bottom-up procedure which is adapted to be time-nested or over-lapped with the conventional bottom-up addition procedure. The system implementation is such that the compare operation has a computation time which is comparable to that necessary for a sequential add operation while, at the same time, using a logic complexity which is essentially the same as that required for a minimum logic compare operation. The time-nesting or over-lapping of time offsets for the add and compare operations allows the overall computation of ACS operations to be realized in about half the time necessary for traditional ACS implementations using bottom-up addition in combination with top-down compare operations. Significantly, the marked reduction in computation time is utilized with essentially the same logic complexity, thereby realizing significant economy of cost and power.

More specifically, the present invention provides an improved method for implementing ACS operations for sequential addition of two pairs of first and second numerical quantities to generate third and fourth numerical quantities which are compared in order to identify the smaller quantity thereof. The enhanced ACS implementation method comprises:

(a) a pair of parallel add operations wherein the following steps are performed sequentially until all bits therein have been added along with the associated carry bits: (i) adding the least significant bits (LSBs) of the first and second numerical quantities and generating a corresponding bit and a carry bit, and (ii) adding the next LSBs for the quantities along with the carry bit and generating another bit and carry bit, and (b) a compare operation wherein the following steps are sequentially performed for each pair of corresponding bits in the numerical quantities which are the results of the above-noted two parallel additions: (i) designating one of the third and fourth numerical quantities as the "contingent" smaller (or larger, as the case may be) quantity; (ii) comparing the LSBs of the quantities and retaining the contingent designation of step (ii) if the two are equal or if the smaller of the compared bits corresponds to the previously designated "contingent" quantity, otherwise designating the quantity not designated at step (i) as the "contingent" smaller quantity; (iii) comparing the next LSBs of the quantities and retaining the contingent designation of step (ii) if the two are equal or if the smaller of the compared bits corresponds to the previously designated "contingent" quantity, otherwise designating the quantity not designated at step (i) as the "contingent" smaller quantity; and (iv) designating the quantity remaining designated as the "contingent" smaller quantity as the "final" smaller quantity when all corresponding bit pairs of the third and fourth numerical quantities have been compared.

The end result of the above-identified novel ACS implementation using the bottom-up compare operation is that time-nesting or over-lapping of the time offsets for the add and compare operations becomes possible because the compare operation offset is also defined from high order to low order bit, as is the add operation offset. Accordingly, the comparison of LSBs of the third and fourth numerical quantities, as part of the compare operation, can be initiated as soon as the corresponding LSBs of the third quantity have been generated by the addition of corresponding LSBs of the first and second numerical quantities, thereby realizing effective time over-lapping of the add and compare operations. This ACS implementation using bottom-up compare operations effectively compresses the computation time by almost a factor of two compared to the traditional ACS strategy of using bottom-up add operations followed by top-down compare operations—significantly, this time compression is realized with essentially no increase in overall system complexity.

BRIEF DESCRIPTION OF THE DRAWINGS

Other advantages of the invention will become apparent upon reading the following detailed description and upon reference to the drawings in which.

DETAILED DESCRIPTION OF THE PREFERRED EMBODIMENTS

As indicated above, the enhanced ACS implementation described and claimed herein is particularly adapted for use with digital data detection applications wherein decoding is based on the application of the well-known Viterbi algorithm to the problem of eliminating inter-symbol interference in baseband communication systems and the like. It should be noted that the Viterbi algorithm and a variety of applications thereof to Viterbi detectors or decoders are well known to those skilled in the art and are, accordingly, not described in detail herein. It suffices to state for purposes of the present disclosure that the ACS implementation disclosed and claimed herein is particularly applicable for use as the basis for ACS units to be operated in conjunction with the transition metric units and the selection memory units typically used in Viterbi decoders. It will, however, be appreciated by those skilled in the art, having the benefit of the present disclosure, that the ACS implementation disclosed and claimed herein may be applied effectively in various other digital implementations involving sequential addition of first and second numerical quantities to generate a third numerical quantity which is, in turn, compared to a fourth numerical quantity to identify the smaller or larger quantity thereof.

Figure 1:
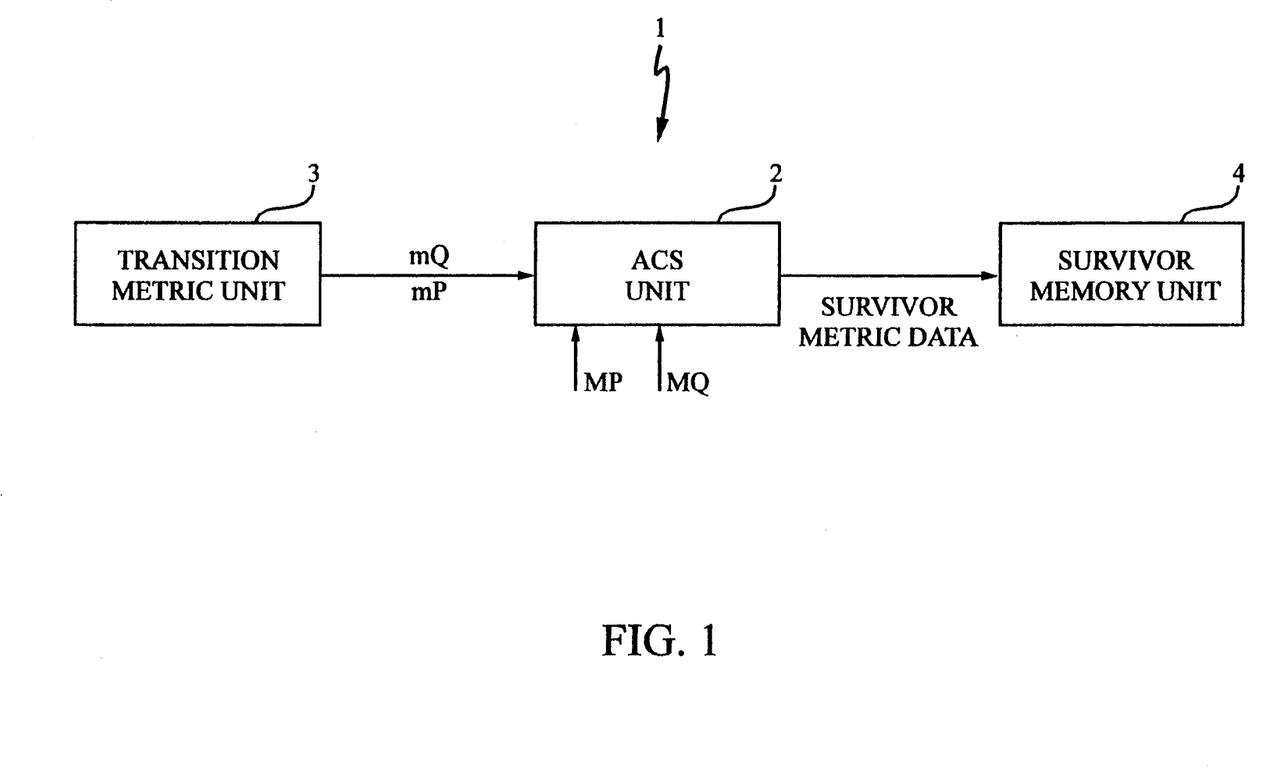
FIG. 1 is an illustrative ACS unit system wherein the novel ACS implementation according to the present invention may advantageously be used.

Referring first to FIG. 1, there is shown an illustrative ACS unit system 1 wherein the novel ACS implementation according to the present invention may advantageously be used. As shown therein the ACS system includes an ACS unit 2 which is adapted to receive and store therein path metric signals corresponding to data representing a pair of path metric quantities MP and MQ. The ACS unit 2 is linked to an associated transition metric unit 3 for receiving therefrom transition metric signals identifying data representing a corresponding pair of transition metric quantities mP and mQ. The ACS system 2 is adapted to adding the first path metric quantity MP to the corresponding transition metric quantity mP in order to generate a third path metric quantity P. Similarly, the ACS unit 2 also adds the second path metric quantity MQ to the corresponding transition metric quantity mQ in order to generate a resulting fourth path metric Q. The ACS unit 2 also compares the two resulting path metric quantities P and Q in order to identify the smaller of the two quantities. As a result of the overall add/compare operation, the ACS unit 2 generates as its output survivor metric data which is fed to an associated survivor memory unit 4. The data supplied by the ACS unit 2 to the survivor memory unit 4 is used selectively by register exchange architecture associated with the overall Viterbi decoder system, details pertaining to which are not necessary for purposes of the present disclosure and are, accordingly, not described herein.

The survivor metric data generated by the add/compare process within the ACS unit 2 includes an output signal designating the specific one of the resulting path metric quantities as the smaller one thereof, i.e., the survivor, as well as binary data corresponding to the designated survivor path metric quantity. The novel ACS implementation according to the system of the present invention is particularly adapted to efficiently performing the add/compare operations performed by the ACS unit 2 illustrated in FIG. 1.

The advantages and functional details of the novel ACS implementation according to the present invention are highlighted and better understood by first considering the traditional ACS implementation wherein the add operation is realized according to a bottom-up implementation in combination with a compare operation which is realized by a top-down implementation. More specifically, the conventional add operation involves the following sequential steps performed until all bits in the numerical quantities (alternatively referred to herein as numbers or words) have been added: (i) adding the least significant bits (LSBs) of first and second numbers or words P and Q, respectively, and generating a bit and a corresponding carry bit, and (ii) adding the next LSBs for the words along with the carry bit and generating another bit and carry bit. Such an add operation, accordingly, is a bottom-up operation where results of the add operations involving the LSBs are first realized, followed successively by the add operation results for the next LSBs, and so on.

In such conventional ACS implementations, the compare operation is realized as a top-down operation wherein the highest order bits of the compared quantities are first examined and the smaller (or larger, if that is the intent) bit is selected, if possible. If the compared highest order bits are found to be equal, the next highest data bits are compared in order to select the smaller of the compared bits, if possible. This process is iterated until all bit pairs in the compared words are exhausted. It will be apparent that the complexity for comparing low order bits is inherently higher than that necessary for high order bits; accordingly, the computation time is relatively higher for low order bit comparisons.

It should be noted that, with the above-noted ACS implementation using bottom-up add operations in combination with top-down compare operations, time-nesting or over-lapping of the time offsets for the two operations is not possible. This is because the add operation offset is from low order to high order bit while the compare operation offset is from high order to low order bit.

Figure 2:
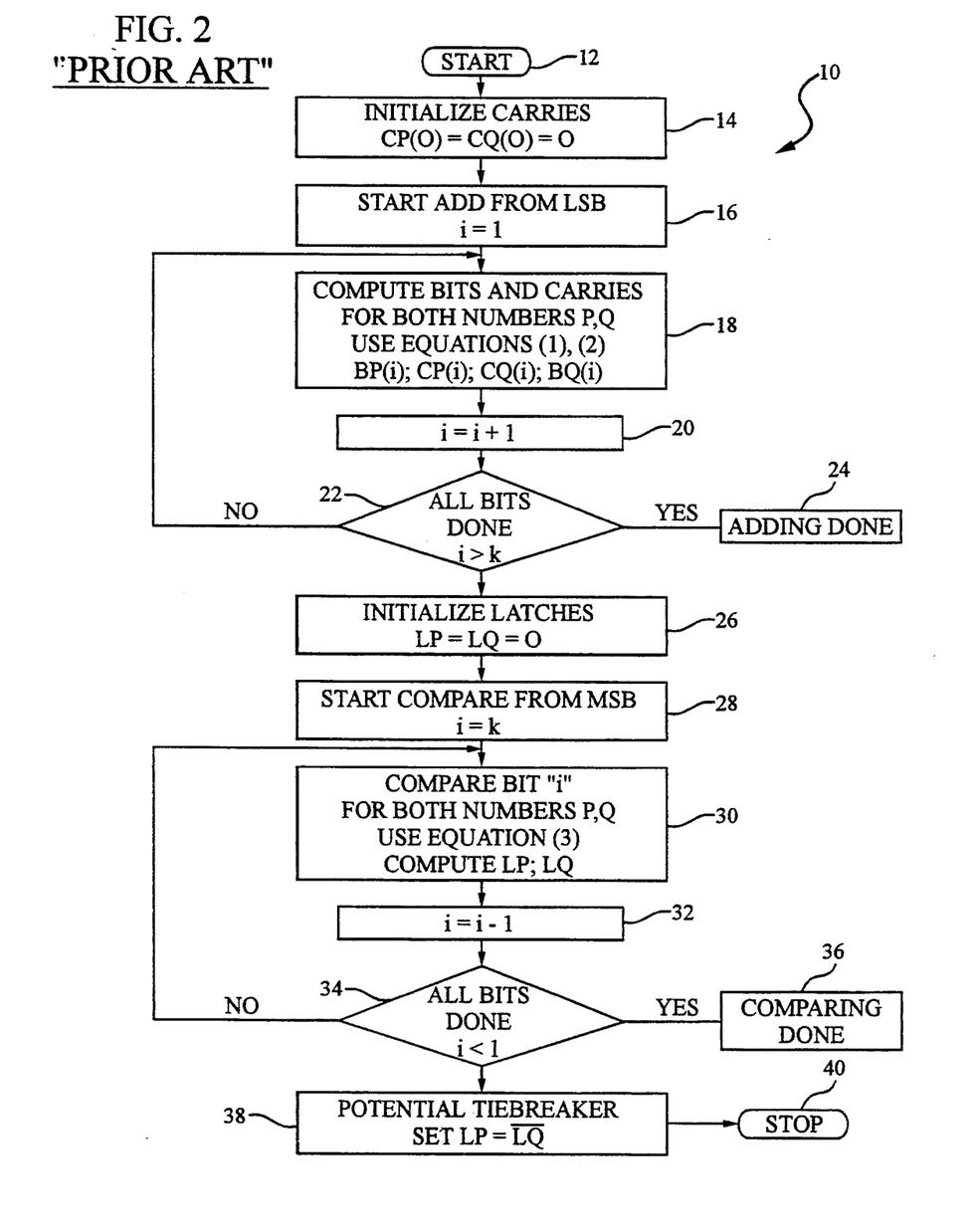
FIG. 2 is a flow chart illustrating the sequence of operations involved in traditional ACS implementations using bottom-up add operations in combination with top-down compare operations.

Referring now to FIG. 2, the conventional ACS implementation is described in conjunction with a flow chart illustrating the sequence of operations corresponding to bottom-up add and top-down compare operations. In the flow chart of FIG. 2, the sequence of operations is started at step 12 for the addition of two numbers designated respectively as P and Q. With particular reference to the ACS unit system described above in connection with the illustration of FIG. 1, it should be noted that the numbers designated as P and Q correspond to the resulting third and fourth path metric quantities which, in turn, are generated by the addition of corresponding sets of first and second path and transition metric quantities.

In effect, the first path and transition metric quantities are added by sequential addition of corresponding bits thereof in order to realize the resulting bits of the third path metric quantity; the number designated as P effectively corresponds to this quantity. Similarly, the second path and transition metric quantities are added by sequential addition of corresponding bits thereof in order to generate the resulting corresponding bits of the fourth path metric quantities; the number designated as Q effectively corresponds to this quantity. With conventional ACS implementations, it is necessary for the completion of the above-noted add operation pertaining to the first and second path and transition metric quantities before the compare operation upon the resulting path metric quantities may be initiated.

This conventional process is described below in connection with the flow chart of FIG. 2. At step 14, the carry bits for both the numbers, i.e., CP (0) and CQ (0) are set to 0.

Subsequently at step 16, the add operation is initiated with the least significant bit (LSB), indicated by setting the bit designation parameter "i" to 1. At the next step, i.e., step 18, the respective add bits and carry bits are computed for both the numbers P and Q. More specifically, the add bit for the number P is generated in accordance with the following relationship:

$$BP(i)=MP(i)mP(i)CP(i-1)+\overline{MP(i)}\,\overline{mP(i)}C\text{-}P(i-1)+\overline{MP(i)}mP(i)\overline{CP(i-1)}+MP(i)mP(i)\overline{C}\text{-}P(i-1) \quad (1)$$

In Equation (1) and the following equations, the bar "—" on top of an entity denotes the logical complement thereof, the "+" between single bits denotes the logical "OR" operation, and a blank between bits denotes the logical "AND" operation. Further, P corresponds to the first number as defined by [BP(K), BP(K−1), ..., BP(1)]. In addition, P is defined as MP+mP where MP is the path metric defined by [MP(K), MP(K−1), ..., MP(1)] while mP is the corresponding branch metric defined by [mP(K), mP(K−1), ..., mP(1)]. The corresponding carry bits are defined by [CP(K), CP(K−1), ..., CP(1)], and "K" corresponds to the number of bits.

In particular, the carry bits for the two numbers are generated in accordance with the following relationship:

$$CP(i)=MP(i)CP(i-1)+mP(i)CP(i-1)+MP(i)mP(i) \quad (2)$$

In practice, it is ensured through the use of appropriate overflow control logic, that CP(K)=0. It should be noted that the corresponding add bits and carry bits for the second number Q are calculated on a basis similar to that defined by Equations (1) and (2).

Returning to the flow chart of FIG. 2, at step 20, the bit under consideration is incremented by setting i=i+1 in preparation for the computation of subsequent bits and carries. Next, at step 22, a check is made to see if all bits have been considered, i.e., whether the bit parameter "i" exceeds the number of bits "K". If the answer at step 22 is found to be false, step 18 is accessed again and the computation of bits and carries iterated until step 22 results in a true answer. At that point, step 24 is reached indicating the completion of the add operation.

The generation of a true answer at step 22 also leads to step 26 where latches LP and LQ which are respectively associated with each of the compared numbers and which define the corresponding number as the one identified as the smaller (or larger, as the case may be) of the compared numbers are initialized. As indicated in the flow chart of FIG. 2, at step 26, the latch values LP and LQ corresponding to the numbers p and Q are set to 0.

Subsequently, at step 28, the compare operation is started from the most significant bit (MSB) for the compared numbers. In particular, the bit identification parameter "i" is set to the value "K" which corresponds to the total number of bits in the numbers to be compared.

At step 30, the designated bits for the two numbers P and Q are compared in order to compute the latch values LP and LQ on the basis of the following relationship (shown specifically for latch LP but also applicable generally to latch LQ):

$$LP=LP+BQ(i)\overline{BP(i)}\overline{LQ} \quad (3)$$

It should be noted that the designation of a "high" value or "1" to any of the latch values LP and LQ designates the corresponding number (P or Q) as being selected as a result of the compare operation.

At step 32, "i" is decremented in order to prepare for the compare operation on the next significant bit of each of the compared numbers. Subsequently, at step 34, a check is made to see if all bits have been considered, i.e., whether "i" corresponds to a value less than 1. If the answer is found to be false, step 30 is accessed again and the compare operation is reiterated until step 34 yields a true answer. At that point, step 36 is accessed and provides an indication that comparing of the numbers is completed.

Following the generation of a true answer at step 34, it is important that one of the compared numbers be specifically designated as being selected. Accordingly, at step 38, a tiebreaker action is undertaken by designating one of the latch values (here, LP) as being equal to the complement of the other latch value (here, LQ), and the overall add/compare operation comes to a halt at step 40.

Even if logic networks of increased complexity are used to execute the add operation to minimize the computation time by use of carry-look-ahead strategies and the like, some degree of time offset always exists because the complexity for high order bits is always greater than that for low order bits and this increased complexity correspondingly increases the computation time. Moreover, the top-down compare operation entails inherently higher complexity for comparing low order bits than for the high order bits so that the computation time is always higher for low order bits. The end result is that time-nesting or overlapping of the time offset for the add and compare operations is not possible because the add operation offset is, as noted above, from low order to high order bit while the compare operation offset is from high order to low order bit.

This inherent disadvantage associated with conventional ACS implementations is overcome by the novel system of the present invention wherein the compare operation (like the add operation) is also implemented as a bottom-up operation so that the compare operation may conveniently be time-nested with the add operation. This enhanced ACS implementation is now described in more operational detail with respect to the flow chart 50 of FIG. 3, according to the principles of the present invention.

Again, with respect to the illustrative ACS unit system described above in connection with FIG. 1, the numbers P and Q used below in connection with the flow chart of FIG. 3 correspond to the resulting third and fourth path metric quantities. In particular, the number P is generated by the addition of the first path and transition metric quantities by sequential addition of corresponding bits thereof in order to generate the resulting corresponding bits of the third path metric quantity. Similarly, the number Q is generated by the addition of the second path and transition metric quantities by sequential addition of corresponding bits of the fourth path metric quantity. The ACS implementation according to this invention is aimed at permitting time-nesting of the add operations with the subsequent comparison of the resulting third and fourth path metric quantities, i.e., the numbers P and Q, so that the compare operations may be initiated at substantially the same time as the add operations are performed. This process is described below in connection with the flow chart of FIG. 3.

Figure 3:
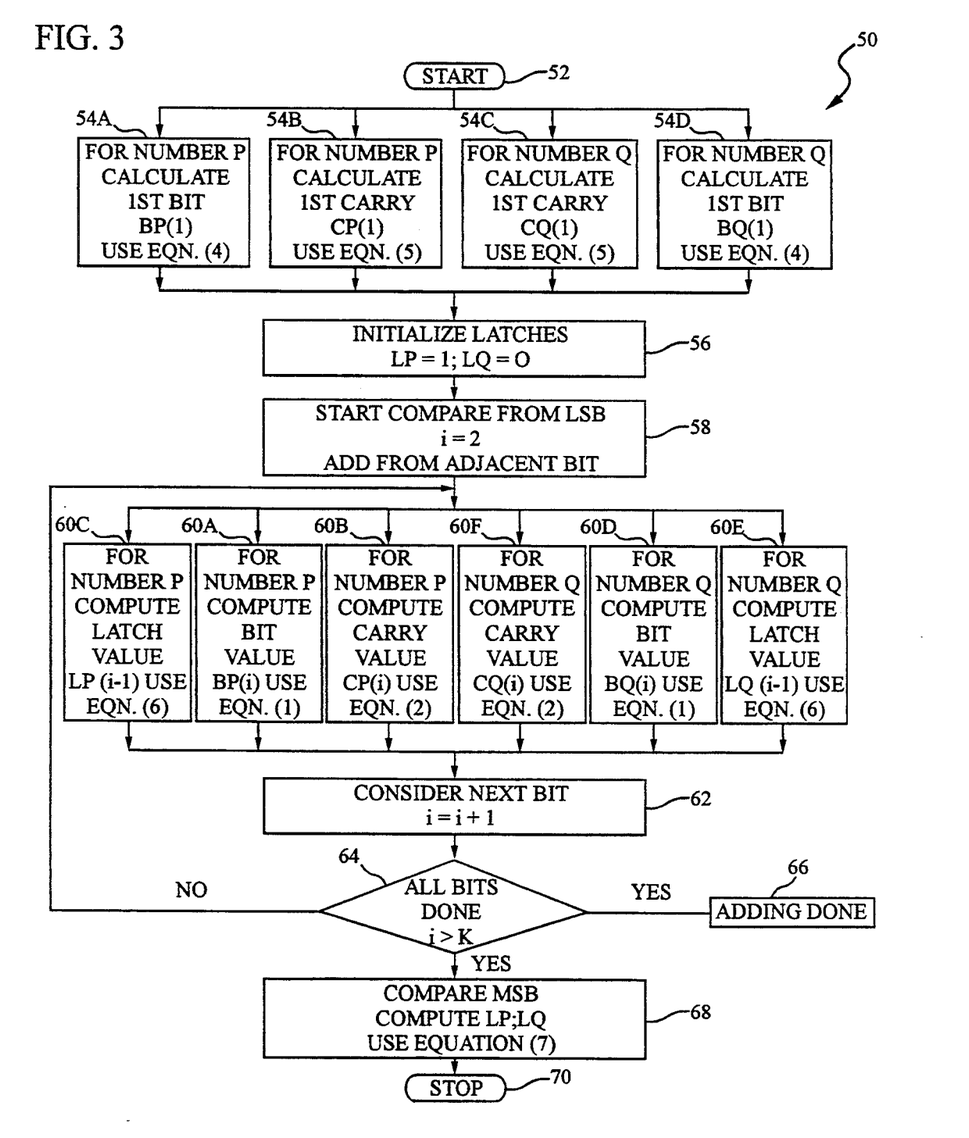
FIG. 3 is a flow chart illustrating the sequential flow of operations involved in the novel ACS implementation using bottom-up compare operations in combination with bottom-up add operations, in accordance with the system of the present invention.

As shown in FIG. 3, the sequence of operations is initiated at step 52. Subsequently, the first bits for the corresponding pairs of first and second path and respective transition metric quantities are added in order to generate the two numbers P and Q by computing the corresponding bits and carries. More specifically, at step 54A, the first bit corresponding to the number P is computed in accordance with the following relationship.

$$BP(1) = MP(1)\overline{mP}(1) + \overline{MP}(1)mP(1) \qquad (4)$$

Next, at step 54B, the carry bit corresponding to the first bit of number P is computed in accordance with the following relationship.

$$CP(1) = MP(1)mP(1) \qquad (5)$$

At the same time, at steps 54C and 54D, the corresponding carries and bits CQ(1) and BQ(1), respectively, are computed for the number Q essentially in correspondence with the relationships shown at Equations (4) and (5) above.

Subsequently, at step 56, the latches LP and LQ which correspond to the numbers P and Q, respectively, and designate the associated number as being selected as being the smaller (or larger, as the case may be) of the compared numbers are initialized by setting the latch values to predefined values to be described below.

Subsequently, at step 58, the compare operation is started from the least significant bit while the add operation is continued from the adjacent bit by setting the bit designation parameter "i" as being equal to 2. Next, the add operation is performed on the designated bit while the compare operation is simultaneously performed on the relative "previous" bit (bit "i−1"). More specifically, at steps 60A and 60B, for the number P, the add bit and carry bit, respectively, are computed for the designated bit "i" using the relationship designated above at Equations (1) and (2). At the same time, at step 60C, the latch value LP for bit "i−1" is computed in accordance with the following relationship:

$$LP = \overline{BP}(i-1)LP + BQ(i-1)LP + \overline{BP}(i-1)BQ(i-1) \qquad (6)$$

At the same time, similar computations are performed to compute the add and carry bits (at steps 60D, 60E, respectively) for the number Q and to compute the corresponding latch value LQ (at step 60F), again using the corresponding relationships illustrated by Equations (1), (2) and (6), respectively.

Step 62 is next accessed where the next bit, i.e., bit "i+1", is considered for performing the above-noted add/compare operations. Next, at step 64, a check is made to see if all bits in the compared numbers have been considered, i.e., whether "i" has a value greater than "K" which is the number of bits in the numbers P and Q. If the answer at step 64 is found to be true, step 66 is accessed indicating the end of the comparison operation.

However, if the answer at step 64 is found to be false, it is an indication that all bits in the compared numbers have not been considered or compared and, accordingly, steps 60A–60E are again accessed so that the add/compare operations may be reiterated.

A true answer at step 64 also leads to step 68 where the most significant bits of the compared numbers are compared and the latch values LP and LQ are compared. In particular, the latch value LP is computed in accordance with the following relationship:

$$LP = \overline{BP}(K)LP + BQ(K)LP + \overline{BP}(K)BQ(K) \qquad (7)$$

This relationship essentially corresponds to that listed above in Equation (6) and is also used to generate the corresponding latch value LQ.

At this point, a check would have normally been necessary to see if the compared numbers have been found to be equal so that, after the compare process described above, the latch values LP and LQ are both found to be equal to 0. If this happens to be true, it would become necessary to force the designation of one of the two compared "equal" numbers is forced by defining one of the latch values (here LP) as being equal to the complement of the other latch value (here LQ). However, in accordance with the feature of the present invention, the need for checking the latch values in order to see if they are in fact equal is eliminated by the selection of predefined values to which the latch values are originally initialized.

More specifically, at step 56 (described above) one of the latch values is initialized to "0" while the other is initialized to "1". Since the present ACS approach assigns "contingent" winner designations, as described below, and changes designations only if necessary based on a particular compare operation, such an assignment of initialization values to the latch values ensures that the end result of the process outlined in FIG. 3 is the designation of one of the compared quantities as the selected "survivor" quantity even if the compared quantities are found to be equal. In particular, if the compared quantities happen to be the same, the end result is that the quantity corresponding to the latch value which was originally initialized to be "1" ends up being designated as the final winner. Otherwise, the quantity corresponding to the latch value computed as being equal to 1 at step 68 ends up as the designated winner. In any case, the possibility that the computed latch values at step 68 are both equal to zero is avoided.

It will be noted from the above description of the ACS implementation that the use of a bottom-up implementation for the compare operation according to the present invention and the parallel logical generation of the add/carry bits and the latch values renders the compare operation capable of conveniently being time-nested with the add operation. More specifically, the compare operation is implemented as a bottom-up operation whereby the LSBs of the compared numbers are first compared and the smaller of the two bits (if the bits are found to be unequal) is identified and the corresponding number is designated as being a "contingent" winner defining the particular number as being the smaller (or larger, as the case may be) of the compared numbers. Upon subsequent examination of higher order bit pairs, the original contingent choice is retained unless the other number generates a "contingent" designation. After all bit pairs have been examined and compared, the remaining "contingent" winner becomes designated as the "final" winner number.

This bottom-up compare operation is illustrated below with respect to the comparison of two 8-bit binary numbers or words P and Q, where P is defined by bits BP8-BP1 respectively being 0100101 and Q is defined by bits BQ8 and BQ1 respectively being 11010000. In this example, the compare operation is aimed at identifying the smaller of the compared numbers. Following the above-identified sequence of operations, P is first designated as the "contingent" smaller number and the lower order bits are then examined. In the instant example, bit BP1 equals 1 while BQ1 equals 0. Since BQ1 is less than BP1, the number Q is declared as the contingent winner. Bits BP2 and BQ2 are next examined. Since BP2=0 and BQ2=0, i.e., both compared bits are equal, the number Q is retained as the contingent winner.

Subsequently, bits BP3 and BQ3 are examined. Since BQ3=0 and BP3=1, i.e., BQ3 is less than BP3, the number Q is re-declared as being the contingent winner; in effect, therefore, the winner designation is not changed. Continuing on a similar basis, the examination of bit BP4, which equals 0, with bit BQ4, which also equals 0, leaves the number Q remaining as the contingent winner and the contingent designation remains the same.

However, the examination of bit BP5, which equals 0, with bit BQ5, which equals 1, leads to the number P being designated as the contingent winner since BP5 is found to be less than BQ5. At this time, the old status of the number Q as being the contingent winner is erased.

When bit BP6, which equals 1, is compared to bit BQ6, which equals 0, the number Q is re-established as the contingent winner since BQ6 is found to be less than BP6. Subsequently, the examination of bit BP7, which equals 0, relative to bit BQ7, which equals 1, leads to the number P being re-established as the contingent winner since BP7 is found to be less than BQ7.

Finally, the comparison of bit BP8, which equals 1, and bit BQ8, which also equals 1, leads to the number P remaining designated as the contingent winner. Since all bit pairs have been examined at this point, the outstanding contingent winner P is designated as the "final" winner, i.e., the smaller of the two compared numbers.

The significance of the above-described compare implementation using bottom-up operation is that essentially no additional logic is required compared to the traditional top-down compare operation since it is only necessary to replace "hard" decisions with "contingent" decisions. The logic operations are similar; however, with top-down compare operations, no reversal of decision is possible once a winner has been declared, i.e., after one of the compared bits is found to be larger than the other. As a result, it becomes necessary to use tie-breaking logic at the completion of the traditional compare operation.

A major advantage resulting from the enhanced ACS implementation according to the present invention is that comparisons of low order bits can immediately follow addition operation of low order bits without any need to wait for computation of the add operation for corresponding higher order bits. Consequently, time-nesting or overlapping of the add and compare operations becomes possible. For instance, with respect to the example illustrated above, the compare operations for bits BP1 and BQ1 can be initiated as soon as the add operations for these bits are completed, i.e., as soon as the add operations necessary for creating bits BP1 and BQ1 are completed. Subsequently, the add operations for bits BP2 and BQ2 can be executed while the compare operations for bits BP1 and BQ1 are in process. Immediately thereafter, the compare operations for bits BP2 and BQ2 can be initiated, and so on. The end result of this enhanced implementation is that the overall computation time is compressed by almost a factor of two compared to the traditional strategy using bottom-up add operation in conjunction with top-down compare operations. Significantly, this time compression is achieved with virtually no addition to the logic complexity of the system.

It should be noted that the above described novel ACS implementation can also be applied effectively to carry-look-ahead (CLA) type of add/compare approaches using adders and comparators having a relatively complex logic. For instance, while the add/compare operations have been described above as being performed from LSB to MSB, one bit at a time, the operations could alternatively be implemented two or more bits at a time. The end result is to substantially improve the associated logic speed. Although the need for complex adder/comparator logic could correspondingly increase system complexity and expense, the present ACS approach would still realize increased operational speed by permitting time-nesting of the add and compare operations multiple bits at a time. For instance, using a two bit approach, once two bits have been added and the subsequent two bits are being added, the compare operation may be initiated on the previously-added two bits, and so on.

It should also be noted that the novel ACS implementation disclosed herein can also be used effectively in conjunction with conventional approaches using a parallel word scheme for accelerating implementation of the Viterbi algorithm by realizing the add and compare-select operations in two different stages. As a result, the accelerated computation time realized by the parallel word scheme can be further compressed by almost a factor of two.

Figure 4:
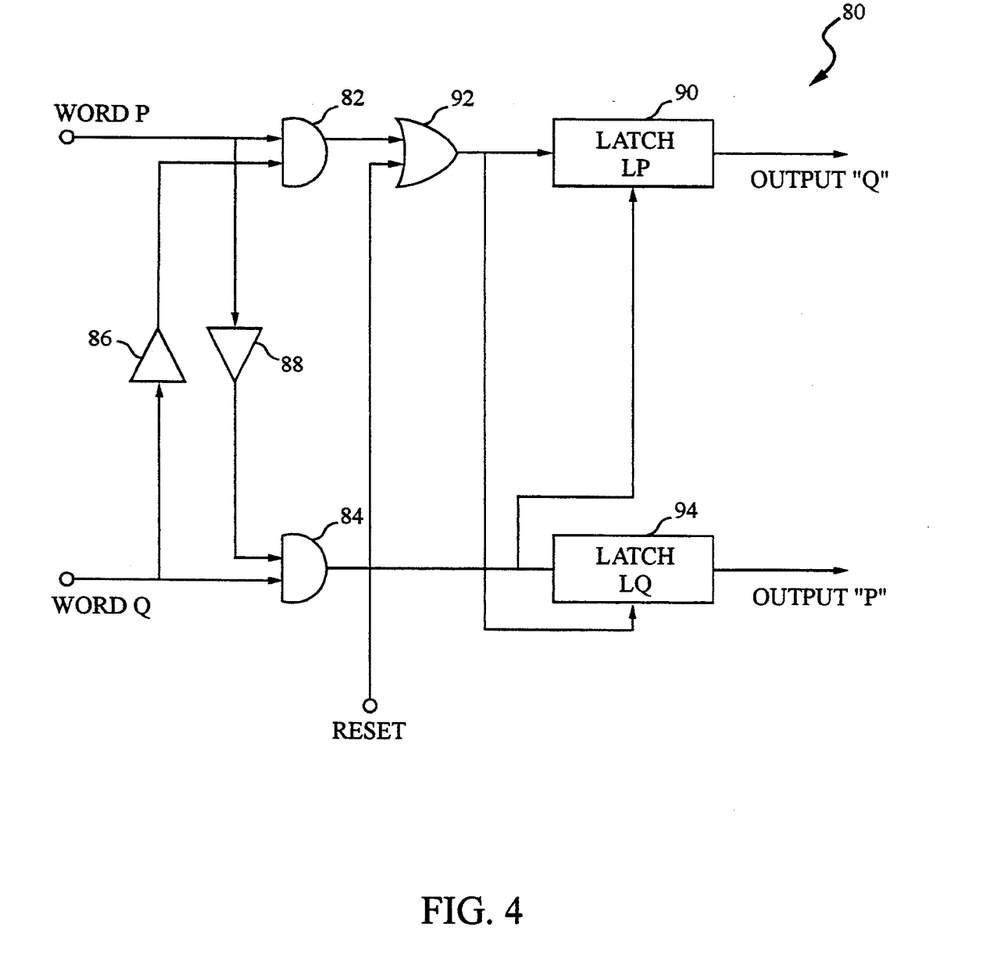
FIG. 4 is an illustrative logic implementation for realizing the compare operation according to a preferred embodiment of the present invention.

Referring now to FIG. 4, there is shown an illustrative logic implementation of the bottom-up compare strategy according to a preferred embodiment of the present invention. It should be noted that the logic implementation 80 of FIG. 4 effectively realizes the sequential procedure illustrated and described above in connection with the flow chart of FIG. 2.

In particular, separate AND gates 82 and 84 are provided for sequentially accepting bits correspondingly respectively to the numbers or words Q and P. Each of the gates 82 and 84 also receives the complement of the bits corresponding to the other input word respectively through inverters 86 and 88. The output of the AND gate 82 is fed as an input to an OR gate 92. The output of OR gate 92 is fed to a latch 90 which has an output value LP which corresponds to an output ("P") having a "high" status indicating that the word P is the smaller one of the compared input words.

The output of AND gate 84 is provided directly as the input to a latch 94 which has an output value LQ corresponding to an output "Q" having a "high" status indicative of the fact that the word Q is the smaller of the compared input words. The output of gate 84 is also directly fed to as a control input to the latch 90.

A latch reset signal is fed to latch 90 through the OR gate 92. The same reset signal is fed in through the OR gate 92 as a control input to the latch 94. The manner in which each of these latch values LQ and LP is appropriately computed corresponds to the procedure described above in detail in connection which the flow chart of FIG. 3.

It should be noted that the novel ACS implementation according to the present invention has been illustrated and described herein as particularly applied to positive numerical quantities. It will be understood by those skilled in the art having the benefit of this disclosure that the approach can be applied effectively to both positive and negative quantities with appropriate minor modification in the last-bit logic used to implement the ACS approach.

What is claimed is:

1. A method for improving the performance of a Viterbi decoder that models system events for a digital system as a finite-state discrete-time state transition diagram having paths that correspond to said system events, said Viterbi decoder determining a most efficient set of said system events by evaluating transition metrics corresponding to said paths, said digital system executing said most efficient set of system events based on an output from said Viterbi decoder, said Viterbi decoder using an add-compare-select ("ACS") operation for sequential addition of two pairs of numerical quantities, said numerical quantities corresponding to transition metrics, to generate two resultant numerical quantities, said resultant numerical quantities corresponding to new transition metrics, said method comprising the steps of:

(i) for each of said pairs of numerical quantities, adding the least significant bits (LSBs) of the first and second numerical quantities and generating a bit and a corresponding carry bit, (ii) adding the next LSBs for said quantities along with said carry bit and generating another bit and carry bit, if necessary;

(iii) repeating step (ii) until all bits in said numerical quantities have been added along with the associated carry bits to generate said resultant numerical quantities;

(iv) declaring one of said resultant numerical quantities a "contingent" smaller quantity;

(v) comparing the LSBs of said resultant numerical quantities and retaining the contingent designation of step (iv) if the two are equal or the smaller of the compared bits corresponds to the "contingent" quantity designated at step (iv), otherwise designating the quantity not designated at step (iv) as the "contingent" smaller quantity;

(vi) comparing the next LSBs of said resultant numerical quantities and retaining the contingent designation of step (v) if the two are equal or the smaller of the compared bits corresponds to the "contingent" quantity designated at step (v), otherwise designating the quantity not designated at step (v) as the "contingent" smaller quantity;

(vii) repeating step (vi) for each pair of corresponding bits in said resultant numerical quantities;

(viii) designating the "contingent" smaller quantity at the end of step (vii) as the smaller of the resultant numerical quantities, said smaller of said resultant numerical quantities representing a transition metric corresponding to a path that represents said most efficient set of system events; and (ix) executing said most efficient set of system events with said digital system.

2. The method of improving the performance of a Viterbi decoder according to claim 1 wherein the comparison of LSBs of said two resultant numerical quantities as part of steps (v), (vi) and (vii) is initiated when the corresponding LSBs of said two quantities have been generated by the addition of corresponding LSBs of said two pairs of numerical quantities.

3. The method of improving the performance of a Viterbi decoder according to claim 2 wherein said add and compare operations are performed using groups of two or more consecutive LSBs of said numerical quantities at a time.

* * * * *